United States Patent [19]

Moy et al.

[11] Patent Number: 5,173,519

[45] Date of Patent: * Dec. 22, 1992

[54] CONDUCTIVE METAL-FILLED COMPOSITES VIA DEVELOPING AGENTS

[75] Inventors: Paul Y. Y. Moy, Des Plaines; William J. E. Parr; Dieter Frank, both of Naperville, all of Ill.; Ronald Hutton, Faversham, England

[73] Assignee: Akzo nv, Arnhem, Netherlands

[*] Notice: The portion of the term of this patent subsequent to Oct. 9, 2007 has been disclaimed.

[21] Appl. No.: 613,840

[22] PCT Filed: Jun. 7, 1989

[86] PCT No.: PCT/US89/02498

§ 371 Date: Jan. 7, 1991

§ 102(e) Date: Jan. 7, 1991

[87] PCT Pub. No.: WO89/12306

PCT Pub. Date: Dec. 14, 1989

[51] Int. Cl.$^5$ .................. G21F 1/10; G21K 1/10
[52] U.S. Cl. ........................................ 523/137
[58] Field of Search ............................ 523/137

[56] References Cited

U.S. PATENT DOCUMENTS 4,961,879 10/1990 Moy et al. .................... 252/512

Primary Examiner—Paul R. Michl
Assistant Examiner—U. K. Rajguru
Attorney, Agent, or Firm—Louis A. Morris

[57] ABSTRACT

A conductive metal-filled substrate is formed by intermingling copper or nickel particles into the substrate, contacting the metal particles with a specified developing agent, and heating the metal particles and the developing agent. The filled substrates are electrically conductive and are useful for a variety of uses such as EMI shielding.

12 Claims, No Drawings

CONDUCTIVE METAL-FILLED COMPOSITES VIA DEVELOPING AGENTS

BACKGROUND OF THE INVENTION

This invention relates to the formation of substrates which contain a filler such that the filled substrate is rendered electrically conductive. In particular, this invention relates to such a process wherein the conductive filler is formed from discrete particles having a copper or nickel metal surface.

It is frequently desired to incorporate a conductive metal filler in a non-conductive substrate. Such composites are useful for electromagnetic interference (EMI) shielding and so forth, as indicated in Encyclopedia of Chemical Technology, Kirk-Othmer, III Ed., Volume 18, pp. 784-8.

The electrical conductivity occurs by interparticle contact of the filler species. Therefore, it is necessary that the exposed surface of the filler species is highly conductive. Readily available powder of conductive metals such as nickel and copper, however, comprises a non-conductive oxide content present at the surface of the particles. Commercial nickel or copper powders show no or unsufficient conductivity for direct compounding into substrates such as engineering plastics. Therefore, the practice of metal filler is mostly confined to less oxidation-sensitive but more expensive metals such as silver.

It is possible to remove the copper oxide or nickel oxide surface layer by acidic treatment prior to compounding with the plastics. However, this introduces a quite cumbersome additional processing step, since the fine metal particles are readily re-oxidized. Moreover, composites of thermoplastics and acid washed or freshly prepared copper or nickel particles may initially show a good conductivity but tend to loose this conductivity upon aging. This problem of deteriorating conductivity has been recognized in the patent literature and some suggestions were made to overcome the problem.

Thus, Japanese laid-open patent application no. 127,742/83 mentions the use of reducing phosphorous acid derivatives resulting in initial conductivity of the composites. However, it was found that the trivalent phosphorous acid compounds do not remain stable for long periods and fail to produce composites having long-term conductivity. Therefore, a specific pentavalent phosphorus compound was suggested.

British patent application no. 2,171,410 discloses the deposition of an amine compound onto metal powder prior to incorporation in a group of specific polymers containing carboxyl groups. For filling other more general polymers the further deposition of a silane coupling agent is required. The Examples of this patent application essentially are directed to amine-deposited magnetic iron powder, where the surface condition of the metal powder is less important, but rather bulk corrosion of the iron powder should be avoided.

European patent application no. 221434 discloses the improvement of the electrical conductivity of plastic materials by dispersing highly electrically conductive filler elements throughout the volume of the plastic coupled with dispersion of low ionization potential materials in the space separating the conductive fillers. Suitable low ionization potential materials include tertiary amines such as dimethyl aniline.

U.S. Pat. No. 4,122,143 discloses a process for producing a conductive cured product comprising the step of reducing a cuprous or cupric compound to metallic copper. Suitable reducing agents include inorganic acids, such as phosphorous acid, trivalent phosphorous-containing acid or ester type compounds such as phosphites, and reducing sugars such as glucose.

Applicants' co-pending application U.S. Ser. No. 068,593/EP-A-297677 deals with the problem of forming a layer of conductive metal on the surface of a substrate. In contrast, the instant invention deals with the problem or rendering an entire three dimensional substrate conductive.

OBJECTS AND SUMMARY OF THE INVENTION

It is, therefore, a primary object of the invention to provide a method for producing conductive engineering plastic compositions using commercially available oxide-covered copper or nickel metal particles.

It is a further object of the invention to provide a method for producing conductive engineerings plastic compositions showing long-term conductivity.

It is yet a further object of the invention to provide a method of shielding.

These and other objects of the invention are accomplished by contacting the metal particles which are intermingled in an engineering plastic with certain nitrogen developing agents having both a long alkyl, alkenyl or acyl group and a further functionally substituted group having coordinative activity and heating the metal particles and developing agent to develop the long lasting conductivity of the composite.

DETAILED DESCRIPTION AND PREFERRED EMBODIMENTS

One element of the invention is the use of engineering plastics as substrates. In the present specification and claims the expression engineering plastics is defined as thermoplastics that maintain dimensional stability and most mechanical properties above 100° C. and below 0° C. The same definition and the scope of this definition is found in *Encyclopedia of Polymer Science and Engineering*, Ed. John Wiley & Sons. Volume 6, (1986). pp. 94-103, incorporated herein by way of reference. Representative engineering plastics comprise polyamides such as polyamide-6 and polyamide-6.6, polyimides, polyetherimides, polyesters such as polyethyleneterephthalate and polybutyleneterephthalate, polyethers, such as polyphenyleneoxide, polysulfone and certain acrylonitrilebutadiene-styrene polymers (ABS). The engineering plastics may optionally contain further, non-conductive fillers, such as glass fibers.

Another element of the invention is the use of nickel or copper metal particles. Since electrical conductivity occurs by interparticle contact of the filler, the surface condition of the metal particles is material. The metal particle need not be entirely metallic and may comprise a non-metallic nucleus. So, the expression metal particle, as used in the present specification and claims, is meant to encompass particles such as metallized beads or metallized fibre. Metal particles of various shapes may be used, including fibrous, flaky and powdery shapes. Particle shapes of high aspect ratio, such as fibre, tend to require lower loading levels for obtaining conductivity, as indicated at page 785, Kirk-Othmer, l.c. Particle shapes of low aspect ratio, such as spherical particles, tend to require higher load levels. However, by proper selection of the moulding method, e.g. compression moulding, conductivity of the composite can be achieved at low load levels of spherical particles. See Kusy, in S. K. Bhattacharya, Metal-Filled Polymers, Ed. Marcel Dekker Inc., New York and Basel, (19-...), pages 27-41. In this case, it is necessary that the metal particles are small relative to the thermoplastics particles and number average particle sizes of the metal particles below 30 microns are preferred.

It is a requirement of the invention that the metal particles are contacted with a developing agent. Suitable developing agents are amine and ammonium compounds which at their central nitrogen atom carry at least one alkyl, alkenyl or acyl group of from 8 to 20 carbon atoms as well as at least one further group carrying a coordinative functional substituent, the amine and ammonium nitrogen atom and the functional substituent being separated by from two to six other atoms, usually carbon atoms.

Generally, the amines will be the preferred developing agents. The amine can be generated in situ by the use of a quaternary ammonium salt, provided that the developing temperature is sufficient high that the salt thermally degrades to an amine. Thus, compounds such as N,N,N',N',N'-pentamethyl-N-tallow-1,3-propanediammoniums dichloride may be used for in situ generation of the related diamine. This approach has the drawback, however, that some counter ions, e.g. chloride ions, may cause corrosion.

Exemplary amines useful as developing agents, include amines carrying a long-chain aliphatic group such as lauryl or stearyl, or a long-chain aliphatic group containing a degree of unsaturation, such as tallow or oleyl. Further useful amines have a long acyl group, and therefore, contain an amide grouping. Exemplary amines useful as developing agents include amines carrying a coordinative functional substituent such as hydroxy, amino or mercapto. In view of the coordinative capacity of the central amine or amide functionality the present amines may form chelative complexes with metal ions, more particularly copper or nickel ions. To that end the functional substituent should be located sufficiently close to the amine or ammonium nitrogen atom, and the number of intervening atoms should be between two and six, whilst the further group carrying the coordinative functional groups should show sufficient flexibility about the bonds that the molecular structure can be orientated to an interatomic distance between the nitrogen atom and the functional atom of 0.48 nm or less.

Preferred developing agents of the invention include N,N-bis (2-hydroxyethyl) cocoamine, N,N-bis (2-hydroxyethyl) tallowamine. N,N-bis (2-hydroxyethyl) dodecanamide.

The metal particles can be intermingled with the engineering plastic by any conventional means, for example, powder blending or melt blending. Any conventional mixing apparatus is suitable.

The developer should be present in an effective amount. That is an amount sufficient to render the metal particles conductive, or to reduce the surface copper or nickel oxide to a sufficient extent.

The steps of the present method need not be conducted in the order indicated in the claims. So, the metal particles may be contacted with the developing agent prior to or simultaneously with intermingling in the engineering plastic. Of course, heating the metal particles and the developing agent for improving conductivity requires a prior contacting step.

The heating step of the method according to the invention is conveniently, and therefore preferably, combined with an intermingling or moulding step. Thus, when using moulding techniques, such as injection of moulding, the components—metal particles, developing agent and engineering plastics—of the composite produced according the invention, can be fed separately or in any convenient combination to the extruder section of the injection moulding apparatus. This will provide for substantial absence of oxygen during heating with concurrent melting of the engineering plastic and contacting of the metal particles and the developing agent, whereby development of conductivity occurs during the intermingling step and conductive granules are obtained for use in any further moulding or shaping procedure. Alternatively, non-conductive powder blends of engineering plastic powder and oxide-covered nickel or copper powder may be prepared at ambient temperature for use in compression moulding at temperatures inducing the development of conductivity.

For obtaining conductivity within an acceptable interval of time, the heating step should take place at temperatures of at least 200° C. up to temperatures at which significant polymer degradation will occur. Most usual molding temperatures for engineering plastic are substantially higher than 200° C., at which temperatures the chemical reactions involving reduction and/or complexation of the copper or nickel oxide surface covering and development of conductivity proceed sufficiently rapid for obtaining conductivity with time intervals equal to or shorter than practical moulding times. Incidental lots of commercial copper or nickel powders may carry exceptionally heavy oxide loadings and require either higher developing temperatures or longer heating cycles, as can be readily established by way of routine experiment. Similarly, the content of developing agent may be varied for achieving the optimized balance between short heating cycles, low developer loading, and low thermal polymer degradation.

The conductive substrates of the invention are useful in a wide variety of applications including EMI shielding, battery plates, electrical switches, and decorative panels.

The following examples are set forth to further explain the invention.

EXAMPLE 1

Nylon 6 (Zytel 211 ®, DuPont) formulations containing various levels of nickel powder (Alcans ® 756), and of N,N-bis (2-hydroxyethyl) tallowamine, were prepared by supplying a dry blend of the mixtures to the throat of a Haake ® twin-screw extruder operating with barrel/die temperatures of 195°/215°/230°/220° C. The nickel powder was used as supplied showing low conductivity, due to its nickel oxide content. The extrudate was pelletized and dried. The pellets were compression molded in a 6"×6"×⅛" (152 mm×152 mm×3.2 mm) closed steel cavity mold for the times, and at the temperatures shown in the Table. After removal from the mold, 3"×6"×⅛ (76 mm×152 mm×3.2 mm) samples were cut and assessed for volume resistancy according to DIN 53596 and for EMI attenuation (near-field); the results obtained are shown in Table I.

TABLE I

| Wt % Ni | Vol % Ni | Wt % Amine | Molding Temp (°C.) | Molding Time (min) | Volume Resistivity ohm cm | EMI Attenuation (dB) at | | | |
|---|---|---|---|---|---|---|---|---|---|
| | | | | | | 30 | 100 | 300 | 1000 MHz |
| 30 | 4.9 | 0 | 240 | 27 | $2.5 \times 10^5$ | 01 | 04 | 06 | 00 |
| 30 | 4.9 | 0 | 240 | 45 | $10^{13}$ | 10 | 03 | 15 | 04 |
| 35 | 6.0 | 0 | 240 | 27 | $10^{13}$ | 00 | 00 | 06 | 00 |
| 35 | 6.0 | 0 | 240 | 40 | $10^{13}$ | 00 | 00 | 06 | 01 |
| 30 | 4.9 | 2.5 | 240 | 27 | 2.4 | 42 | 28 | 39 | 20 |
| 30 | 4.9 | 2.5 | 240 | 45 | 0.24 | 64 | 56 | 72 | 74 |
| 35 | 6.0 | 2.5 | 240 | 17 | 0.24 | 62 | 54 | 65 | 82 |
| 35 | 6.0 | 2.5 | 230 | 15 | 0.22 | 64 | 56 | 70 | 75 |
| 30 | 4.9 | 5.0 | 240 | 27 | 0.23 | 62 | 55 | 67 | 78 |
| 30 | 4.9 | 5.0 | 225 | 15 | 0.11 | 43 | 30 | 44 | 19 |
| 35 | 6.0 | 5.0 | 240 | 20 | 0.21 | 63 | 73 | 77 | 88 |
| 35 | 6.0 | 5.0 | 240 | 15 | 0.18 | 64 | 63 | 77 | 90 |

It can be seen that in the absence of the amine developer of the present invention formulations containing 30 or 35% of nickel powder exhibit high volume resistivity and very low EMI attenuation. In contrast, samples containing the amine developer, molded under identical conditions, exhibit low volume resistivity and high EMI attenuation.

EXAMPLE 2

Nylon 6 extrudates, containing various levels of nickel powder and of N,N-bis (2-hydroxyethyl) tallowamine, produced as described in Example 1 were injection molded on a Newbury 50 ton reciprocating screw machine fitted with a 4"×3"×1/16" (102×76×1.6 mm) mold cavity. Various barrel/die temperature regimes were employed, together with different overall cycle times (Note: on the machine used the polymer formulation is exposed to barrel temperature for approximately eight times the cycle time). After molding, the samples were evaluated for volume resistivity. The results are shown in the Table II.

TABLE II

| Wt % Ni | Vol % Ni | Wt % Amine | Cycle Time(s) | Barrel/ Die Temp (°C.) | Volume Resistivity ohm cm |
|---|---|---|---|---|---|
| 35 | 6.0 | 0 | 90 | 245/260/260 | $1.4 \times 10^7$ |
| 35 | 6.0 | 2.5 | 90 | 235/250/250 | $7.6 \times 10^7$ |
| 35 | 6.0 | 2.5 | 90 | 240/255/255 | $3.0 \times 10^7$ |
| 35 | 6.0 | 2.5 | 90 | 245/260/260 | 1.5 |
| 35 | 6.0 | 1.0 | 90 | 245/260/260 | 0.2 |
| 35 | 6.0 | 1.0 | 60 | 245/260/260 | 0.48 |

It can be noted that enhancement of the volume conductivity can be achieved by the use of the amine developer of the present invention at a level of 1 wt. %.

EXAMPLE 3

Nylon 6 extrudates containing 35 wt. % of nickel powder and 1 wt. % of (2-hydroxyethyl) tallowamine, produced as described in Example 1, were injection molded on a Newbury 50 ton reciprocating screw machine, as described in Example 2, using cycle times of 60 and 90 sec., respectively.

The molded samples were placed in a forced air oven at 85° C. and evaluated for volume resistivity at time intervals of 1 week. Table III reports the volume resistivities in ohm.cm as the average value for three individual samples. In this accelerated aging test the volume resistivities remained essentially constant over the test period.

TABLE III

Heat Aging Study at Nickel Filled Nylon 6

| Days | Volume Resistivity (ohm · cm) | |
|---|---|---|
| 0 | 1.5*) | 0.5**) |
| 7 | 1.5 | 0.6 |
| 14 | 1.2 | 0.6 |
| 21 | 1.5 | 0.7 |
| 28 | 1.6 | 0.8 |
| 35 | 1.6 | 0.8 |
| 42 | 1.8 | 0.9 |
| 49 | 1.6 | 0.6 |
| 56 | 1.5 | 0.5 |

*)60 sec. mold cycle
**)90 sec. mold cycle

EXAMPLE 4

Polyphenylene oxide (Noryl N225/78 ®, General Electric) formulations containing various levels of nickel powder (Alcan 756) and of N,N-bis (2-hydroxyethyl) cocoamine were prepared by extrusion in a similar fashion to that described in Example 1. The pellets obtained were compression molded. The molding temperatures and times used, and the volume resistivities and EMI attenuations measured are shown in Table IV.

TABLE IV

| Wt % Ni | Vol % Ni | Wt % Amine | Molding Temp (°C.) | Molding Time (min) | Volume Resistivity ohm cm | EMI Attenuation (dB) at | | | |
|---|---|---|---|---|---|---|---|---|---|
| | | | | | | 30 | 100 | 300 | 1000 MHz |
| 35 | 6.2 | 0 | 225 | 27 | $10^{13}$ | 00 | 00 | 01 | 00 |
| | | | 240 | 60 | $10^{13}$ | 00 | 00 | 02 | 00 |
| | | | 255 | 20 | $10^{13}$ | 00 | 00 | 04 | 00 |
| 35 | 6.2 | 5 | 225 | 27 | $10^{13}$ | 00 | 00 | 05 | 01 |
| | | | 240 | 60 | 7.7 | 35 | 29 | 30 | 11 |
| | | | 255 | 20 | 0.2 | 57 | 52 | 70 | 72 |
| 40 | 7.6 | 5 | 257 | 15 | 0.21 | 52 | 43 | 55 | 63 |

Again it is clear that an amine developer of the present invention effects a dramatic increase in the volume conductivity and EMI attenuation of nickel filled polyphenylene oxide formulations. Also note that the molding temperature has to be sufficiently high to allow the amine developer to function effectively in a reasonable time.

EXAMPLE 5

Formulations of polybutylene terephthalate (PBT) containing 30% glass fiber (Valox 420 ®, General Electric) were compounded as described in Example 1 to contain various levels of nickel filler and various levels of N,N-bis (2-hydroxyethyl) lauramide. The pellets obtained were compression molded for the times, and at the temperatures, shown in the Table below. The values for EMI attenuation and volume resistivity measured are also depicted in Table V.

TABLE V

| Wt % Ni | Vol % Ni | Wt % Amine | Molding Temp (°C.) | Molding Time (min) | Volume Resistivity ohm cm | EMI Attenuation (dB) at | | | |
|---|---|---|---|---|---|---|---|---|---|
| | | | | | | 30 | 100 | 300 | 1000 MHz |
| 35 | 8.4 | 0 | 245 | 22 | $10^{13}$ | 01 | 00 | 14 | 05 |
| 35 | 8.4 | 1 | 245 | 22 | 0.78 | 47 | 37 | 50 | 40 |
| 30 | 6.8 | 1 | 250 | 27 | 0.42 | 52 | 46 | 58 | 48 |
| 30 | 6.8 | 1 | 245 | 27 | 0.79 | 46 | 34 | 47 | 40 |
| 25 | 5.4 | 1 | 245 | 27 | 2.0 | 40 | 30 | 39 | 19 |
| 20 | 4.1 | 1 | 250 | 27 | $10^{13}$ | 04 | 03 | 16 | 03 |

Hence an amide developer of the present invention is able to effect a large increase in the volume conductivity and EMI attenuation of a glass-reinforced, nickel filled, polyester formulation.

EXAMPLE 6

A glass reinforced PBT (Valox 420) formulation was compounded, as described above, to contain 35% by weight of nickel powder and 1% by weight on N,N-bis-(2-hydroxyethyl) lauramide. The resulting pellets were used to produce injection molded specimens using barrel/die temperatures of 250°/270°/270° C. and a cycle time of 90 seconds. When assessed for volume resistivity the molded specimens gave values of approximately 0.29 and 0.45 ohm.cm; i.e., the specimens possessed good volume conductivity.

EXAMPLE 7

PBT extrudates containing 30 wt. % of nickel powder and 1 wt. % of N,N-bis-(2-hydroxyethyl) lauramide, produced as described in Example 5. were injection molded as described in Example 6, using cycle times of 60 and 90 sec., respectively.

The molded samples were placed in a forced air oven at 85° C. and evaluated for volume resistivity at time intervals of 1 week. Table VI reports the volume resistivities in ohm.cm as the average value for three individual samples. Apart from an initial increase the volume resistivities essentially remained constant for the further test period at a level sufficiently low for most EMI-shielding purposes.

TABLE VI

Heat Aging Study at Nickel Filled PBT

| Days | Volume Resistivity (ohm · cm) | |
|---|---|---|
| 0 | 0.5*) | 0.5**) |
| 7 | 2.3 | 1.8 |
| 14 | 2.0 | 1.7 |
| 21 | 3.8 | 5.0 |
| 28 | 3.8 | 5.7 |
| 35 | 4.6 | 3.1 |
| 42 | 4.9 | 4.1 |
| 49 | 5.2 | 5.1 |

TABLE VI-continued

Heat Aging Study at Nickel Filled PBT

| Days | Volume Resistivity (ohm · cm) | |
|---|---|---|
| 56 | 1.6 | 2.5 |

*)60 sec. mold cycle
**)90 sec. mold cycle

EXAMPLE 8

Test bars were prepared and aged in a forced-air oven at 85° C., as described in Examples 3 and 7. The samples were tested for retained tensile strengths at intervals of one week.

Tables VIIA and VIIB report the results of the aging tests for Nylon 6 or PBT/Ni-filled composites developed according to the invention vs. undeveloped and unfilled systems.

TABLE VIIA

Heat Aging Study on Tensile Strengths

| | Tensile Strength, psi (MPa) Sample | | |
|---|---|---|---|
| Days | A | B | C |
| 0 | 6976 (48) | 6964 (49) | 6784 (47) |
| 3 | 6964 (48) | 7390 (51) | 7877 (54) |
| 10 | 6808 (47) | 7410 (51) | 7917 (55) |
| 17 | — | 7681 (53) | 7550 (52) |
| 24 | 5326 (37) | 8223 (57) | 7909 (55) |
| 31 | 5829 (40) | 6514 (45) | 7642 (53) |

A = Nylon 6/Ni/Developer (64/35/1)
B = Nylon 6/Ni/Developer (65/35/—)
C = Nylon 6/Ni/Developer (100/—/—)

TABLE VIIB

| | Tensile Strength, yield-psi (MPa) Sample | | |
|---|---|---|---|
| Days | D | E | F |
| 0 | 10926 (75) | 11280 (78) | 13400* (92) |
| 3 | 10546 (73) | 11241 (77) | — |
| 10 | 11235 (77) | 11729 (81) | — |
| 17 | 11185 (77) | 11088 (76) | — |
| 24 | 11216 (77) | 11491 (79) | — |
| 31 | 10771 (74) | 11425 (79) | — |

*published data
D = gf-PBT/Ni/Developer (69/30/1)
E = gf-PBT/Ni/Developer (70/30/—)
F = gf-PBT/Ni/Developer (100/—/—)

EXAMPLE 9

Using a 3½" (89 mm) single screw extruder two formulations were compounded containing nickel coated graphite fibres (NCG-1204-P-1) as a conductive filler, the nickel coated graphite was used as supplied. Formulation A did not comprise a developing agent according to the invention. Addition of 1 wt. % of developer in Formulation B resulted in a significant decrease of volume resistivity.

|  |  | A | B |
|---|---|---|---|
| PBT (Arnite ® T-06-200, ex Akzo) | wt. % | 64 | 63 |
| Ni-coated graphite fibres | wt. % | 15 | 15 |
| (NCG-1204 P-1, ex Cyanamid) | vol. % | 9.6 | 9.6 |
| Fiberglass (CT-930, ex Owens Corning) | wt. % | 21 | 21 |
| N,N-bis(2-hydroxyethyl)lauramide | wt. % | — | 1 |
| Volume resistivity, ohm · cm |  | 68 | 1.3 |

We claim:

1. A method of forming a conductive metal-filled composite, comprising
   a. an intermingling step of intermingling at least 2 vol. % of oxide-covered copper or nickel metal particles in an engineering plastic;
   b. a contacting step of contacting the metal particles with an effective amount of a developing agent selected from the group of amine or ammonium compounds having at least one alkyl, alkenyl or acyl group of from 8 to 20 carbon atoms and having at least one further group carrying a coordinative functional substituent, the amine or ammonium nitrogen atom and the functional substituent being separated by from two to six other atoms;
   c. a heating step of subjecting the metal particles and the developing agent in the substantial absence of oxygen to improve the conductivity of the metal-filled substrate.

2. The method of claim 1, wherein said heating step takes place at or above the softening point of the engineering plastic.

3. The method of claim 1, wherein said developing agent is incorporated in the engineering plastic.

4. The method of claim 2, wherein said developing agent is incorporated in the engineering plastic during said intermingling step.

5. The method of claim 1, wherein the engineering plastic is selected from the group of polyamides, polyesters, polyphenylene ethers, and ABS resins.

6. The method of claim 1, wherein said coordinative functional substituent is selected from the group of hydroxy, amino, and mercapto.

7. The method of claim 1, wherein said at least one further group carrying a coordinative functional substituent is selected from the group of hydroxyalkyl, aminoalkyl and mercaptoalkyl groups.

8. The method of claim 1, wherein said developing agent has two further groups carrying a coordinative functional substituent.

9. The method of claim 8, wherein the developing agent is selected from the group of bis (2-hydroxyethyl) and bis (2-hydroxypropyl) $C_8$–$C_{20}$-alkyl amines.

10. The method of claim 8, wherein the developing agent is selected from the group of N,N-bis (2-hydroxyethyl) and N,N-bis (2-hydroxypropyl) $C_8$–$C_{20}$- alkyl amides.

11. A conductive metal-filled substrate produced by the method of claim 1.

12. A method of shielding a space from a source of EMI by placing the conductive metal-filled substrate of claim 11 between the source of EMI and the space to be shielded.

* * * * *